US012002748B2

(12) United States Patent
Liu et al.

(10) Patent No.: US 12,002,748 B2
(45) Date of Patent: Jun. 4, 2024

(54) CONTACT WINDOW STRUCTURE, METAL PLUG AND FORMING METHOD THEREOF, AND SEMICONDUCTOR STRUCTURE

(71) Applicant: CHANGXIN MEMORY TECHNOLOGIES, INC., Hefei (CN)

(72) Inventors: Jie Liu, Hefei (CN); Ping-Heng Wu, Hefei (CN); Zhan Ying, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 356 days.

(21) Appl. No.: 17/401,461

(22) Filed: Aug. 13, 2021

(65) Prior Publication Data

US 2022/0093509 A1 Mar. 24, 2022

Related U.S. Application Data

(63) Continuation of application No. PCT/CN2021/099873, filed on Jun. 11, 2021.

(30) Foreign Application Priority Data

Sep. 22, 2020 (CN) ........................ 202011001855.8

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76804* (2013.01); *H01L 21/76814* (2013.01);
(Continued)

(58) Field of Classification Search
CPC ............ H01L 23/5226; H01L 23/5283; H01L 23/53226; H01L 21/76804;
(Continued)

(56) References Cited

U.S. PATENT DOCUMENTS 5,285,110 A 2/1994 Bae
5,320,980 A 6/1994 Bae
(Continued)

FOREIGN PATENT DOCUMENTS

CN 1467826 A 1/2004
CN 1204606 C 6/2005
(Continued)

OTHER PUBLICATIONS

Supplementary European Search Report in the European application No. 21773256.9, dated Apr. 12, 2022, 9 pgs.
(Continued)

*Primary Examiner* — Shahed Ahmed
*Assistant Examiner* — Vicki B. Booker
(74) *Attorney, Agent, or Firm* — Cooper Legal Group, LLC

(57) ABSTRACT

A contact window structure, a metal plug and a forming method thereof, a method of forming the contact window structure and a semiconductor structure are provided. In the method of forming the contact window, an annular pad is formed on a surface of a target layer. A central via, from which partial surface of the target layer is exposed, is formed in the middle part of the annular pad. A dielectric layer covering a substrate, the target layer and the annular pad is formed. The dielectric layer is etched to form an etch hole connected to the central via in the dielectric layer. The annular pad is removed along the etch hole and the central via to enlarge a size of the central via, so as to form the contact window structure by the etch hole and the central via with the enlarged size.

11 Claims, 14 Drawing Sheets

(51) Int. Cl.
*H01L 23/528* (2006.01)
*H01L 23/532* (2006.01)

(52) U.S. Cl.
CPC .... *H01L 21/76816* (2013.01); *H01L 23/5283* (2013.01); *H01L 23/53266* (2013.01)

(58) Field of Classification Search
CPC ......... H01L 21/76814; H01L 21/76816; H01L 2221/1063
See application file for complete search history.

(56) References Cited

U.S. PATENT DOCUMENTS

| | | | | |
|---|---|---|---|---|
| 5,940,731 | A * | 8/1999 | Wu | H01L 21/76804 257/E21.578 |
| 6,136,695 | A | 10/2000 | Lee | |
| 6,232,225 | B1 * | 5/2001 | Pong | H01L 21/76804 438/668 |
| 6,812,577 | B2 | 11/2004 | Lee | |
| 7,026,207 | B2 | 4/2006 | Tsai | |
| 7,041,605 | B2 | 5/2006 | Lee | |
| 7,259,087 | B2 | 8/2007 | Jung | |
| 7,829,410 | B2 | 11/2010 | Plum | |
| 8,039,377 | B2 | 10/2011 | Plum | |
| 8,299,574 | B2 | 10/2012 | Plum | |
| 8,372,724 | B2 | 2/2013 | Takaishi | |
| 8,395,235 | B2 | 3/2013 | Tsuchiya | |
| 8,871,633 | B2 | 10/2014 | Fukasawa | |
| 9,076,804 | B2 | 7/2015 | Liao et al. | |
| 9,230,966 | B2 | 1/2016 | Sapra et al. | |
| 9,293,411 | B2 | 3/2016 | Fukasawa | |
| 9,425,142 | B2 | 8/2016 | Fukasawa | |
| 9,627,359 | B2 | 4/2017 | Fukasawa | |
| 9,859,214 | B2 | 1/2018 | Fukasawa | |
| 9,871,052 | B2 | 1/2018 | Lee | |
| 9,941,206 | B2 | 4/2018 | Kang | |
| 9,978,677 | B2 | 5/2018 | Liu | |
| 10,037,918 | B2 | 7/2018 | Hsu et al. | |
| 10,157,837 | B2 | 12/2018 | Fukasawa | |
| 10,504,839 | B2 | 12/2019 | Fukasawa | |
| 10,622,305 | B2 | 4/2020 | Kang | |
| 2004/0002189 | A1 | 1/2004 | Park | |
| 2004/0046251 | A1 | 3/2004 | Lee | |
| 2004/0197986 | A1 | 10/2004 | Tsai | |
| 2004/0245650 | A1 | 12/2004 | Lee | |
| 2005/0042878 | A1 | 2/2005 | Jung | |
| 2009/0091037 | A1 * | 4/2009 | Assefa | H10N 50/01 257/E21.585 |
| 2009/0134491 | A1 | 5/2009 | Plum | |
| 2010/0295110 | A1 | 11/2010 | Takaishi | |
| 2011/0018098 | A1 | 1/2011 | Plum | |
| 2011/0062552 | A1 | 3/2011 | Tsuchiya | |
| 2012/0001299 | A1 | 1/2012 | Plum | |
| 2012/0119260 | A1 * | 5/2012 | Radulescu | H01L 29/7786 438/689 |
| 2013/0082401 | A1 | 4/2013 | Fukasawa | |
| 2014/0210087 | A1 | 7/2014 | Kang | |
| 2015/0008591 | A1 | 1/2015 | Fukasawa | |
| 2015/0054163 | A1 | 2/2015 | Liao et al. | |
| 2015/0294971 | A1 | 10/2015 | Sapra et al. | |
| 2015/0357313 | A1 | 12/2015 | Fukasawa | |
| 2016/0013191 | A1 | 1/2016 | Sapra et al. | |
| 2016/0307877 | A1 | 10/2016 | Fukasawa | |
| 2017/0110473 | A1 | 4/2017 | Lee | |
| 2017/0117218 | A1 | 4/2017 | Liu | |
| 2017/0207163 | A1 | 7/2017 | Fukasawa | |
| 2017/0345904 | A1 * | 11/2017 | Clark | H01L 21/76877 |
| 2018/0068899 | A1 | 3/2018 | Tapily et al. | |
| 2018/0076126 | A1 | 3/2018 | Fukasawa | |
| 2018/0090511 | A1 | 3/2018 | Nakajima | |
| 2018/0151560 | A1 | 5/2018 | Hsu et al. | |
| 2018/0197815 | A1 | 7/2018 | Kang | |
| 2018/0294225 | A1 | 10/2018 | Lee et al. | |
| 2018/0374744 | A1 * | 12/2018 | Wu | H01L 21/76832 |
| 2019/0080997 | A1 | 3/2019 | Fukasawa | |
| 2020/0020711 | A1 | 1/2020 | Liao | |
| 2020/0027827 | A1 | 1/2020 | Lin et al. | |
| 2021/0035904 | A1 * | 2/2021 | Clevenger | H01L 21/76877 |

FOREIGN PATENT DOCUMENTS

| | | | |
|---|---|---|---|
| CN | 1956184 | A | 5/2007 |
| CN | 101874303 | A | 10/2010 |
| CN | 103094186 | A | 5/2013 |
| CN | 103972158 | A | 8/2014 |
| CN | 104347345 | A | 2/2015 |
| CN | 104425567 | A | 3/2015 |
| CN | 104658962 | A | 5/2015 |
| CN | 104979163 | A | 10/2015 |
| CN | 106611742 | A | 5/2017 |
| CN | 108122845 | A | 6/2018 |
| CN | 108695336 | A | 10/2018 |
| CN | 109037214 | A | 12/2018 |
| CN | 109273430 | A | 1/2019 |
| CN | 211017076 | U | 7/2020 |
| KR | 20050066369 | A | 6/2005 |
| KR | 20080093738 | A | 10/2008 |
| WO | 2018063337 | A1 | 4/2018 |

OTHER PUBLICATIONS

International Search Report in the international application No. PCT/CN2021/099873, dated Aug. 4, 2021, 3 pgs.
International Search Report in the international application No. PCT/CN2021/100740, dated Sep. 15, 2021, 3 pgs.
International Search Report in the international application No. PCT/CN2021/099878, dated Sep. 13, 2021 2 pgs.
International Search Report in the international application No. PCT/CN2021/100699, dated Aug. 31, 2021, 2 pgs.

* cited by examiner

CONTACT WINDOW STRUCTURE, METAL PLUG AND FORMING METHOD THEREOF, AND SEMICONDUCTOR STRUCTURE

CROSS-REFERENCE TO RELATED APPLICATIONS

This is a continuation of International Application No. PCT/2021/099873, filed on Jun. 11, 2021, entitled "CONTACT WINDOW STRUCTURE, METAL PLUG AND FORMING METHOD THEREOF, AND SEMICONDUCTOR STRUCTURE", which claims priority to Chinese patent application No. 202011001855.8, filed on Sep. 22, 2020, entitled "CONTACT WINDOW STRUCTURE, METAL PLUG AND FORMING METHOD THEREOF, AND SEMICONDUCTOR STRUCTURE". The disclosures of International Application No. PCT/2021/099873 and Chinese patent application No. 202011001855.8 are hereby incorporated by reference in their entireties.

TECHNICAL FIELD

The disclosure relates to the field of semiconductor, and in particular to a contact window structure, a metal plug and a forming method thereof, and a semiconductor structure.

BACKGROUND

With the development of integrated circuit to super-large scale integrated circuits, the circuit density inside the integrated circuits is increasing, and the number of components included in the integrated circuits is also increasing. Such development makes the surface of a wafer unable to provide enough area to make required interconnecting wires.

In order to meet the requirement of interconnecting wires after scaling down of the components, the design of two or more layers of multi-layer metal interconnecting wires has become a commonly used method in the super large-scale integrated circuit technology. At present, the conduction between different metal layers or between a metal layer and a pad layer can be realized by a metal plug. As the integration of devices becomes higher and higher, the depth-to-width ratio of vias formed in the process of forming the metal plug continues to increase, which leads to compromised performance relative to the circuit requirements proposed by the designer.

SUMMARY

A technical problem to be solved by embodiments of the disclosure is to provide a contact window structure, a metal plug and a forming method thereof to reduce a phenomenon that a critical size of a bottom of a via is greater than a critical size of a top of the via, and overcome the problem that a size of the via slightly shrinks in an etching process.

Embodiments of the disclosure provide a forming method of a contact window structure, which may include:

- providing a target layer;
- forming an annular pad on a surface of the target layer, wherein a central via, from which partial surface of the target layer is exposed, is formed in a middle part of the annular pad;
- forming a dielectric layer covering the target layer and the annular pad;
- etching the dielectric layer to form an etch hole connected to the central via in the dielectric layer; and
- removing the annular pad to form the contact window structure.

The embodiments of the disclosure further provide a contact window structure, which may include:

- a target layer;
- a dielectric layer, located on the target layer; and
- a contact window, located in the dielectric layer, wherein the contact window comprises an etch hole and a central via connected to each other, the etch hole is located above the central via, partial surface of the target layer is exposed the central via, and a size of the central via is greater than a size of a bottom of the etch hole.

The embodiments of the disclosure further provide a semiconductor structure, which may include:

- a target layer;
- an annular pad, located on a surface of the target layer, wherein a central via, from which partial surface of the target layer is exposed, is formed in the middle part of the annular pad;
- a dielectric layer, covering the target layer and the annular pad; and
- an etching hole, located in the dielectric layer and connected to the central via.

The embodiments of the disclosure further provide a metal plug, which may include:

- a target layer;
- a dielectric layer, located on the target layer;
- a contact window structure, located in the dielectric layer, the contact window structure may include an etch hole and a central via connected to each other, the etch hole may be located above the central via, partial surface of the target layer is exposed from the central via, and a size of the central via may be greater than a size of a bottom of the etch hole; and
- a metal plug filling the contact window structure.

DETAILED DESCRIPTION

Figure 1:
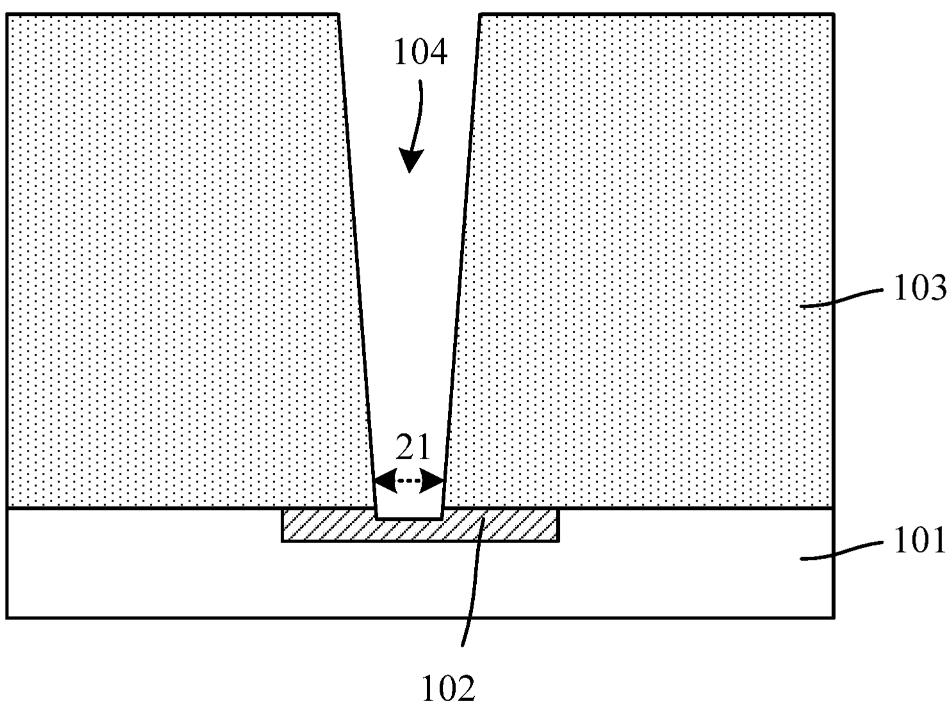
FIG. 1 illustrates a schematic diagram of a structure of a via formed according to the related technology.

With reference to FIG. 1, the process of forming a metal plug in the related technology includes the following steps. A target metal layer 102 is formed in a substrate 101, and the target metal layer 102 is flush with a surface of the substrate 101. A dielectric layer 103 is formed on the substrate 101 and the target metal layer 102. A via (or a contact window structure) 104, from which a surface of the target metal layer is exposed, is formed in the dielectric layer 103. The via (or the contact window structure) is filled with metal (not shown in the figure) to form the metal plug (not shown in the figure).

As the integration of devices becomes higher and higher, a depth-to-width ratio of vias formed in the dielectric layer continues to increase, and the via with high depth-to-width ratio is a big challenge for the etching process. Generally, in a downward etching process, the via gradually narrows, and a critical size 21 of a bottom of the via 104 is smaller than a critical size of a top of the via 104. In this slight shrinkage process, the performance of the circuit may be compromised relative to circuit requirements proposed by the designer. In addition, the window size in the bottom layer of the via usually limit a resistance value of the whole contact window, and the slightly shrunk size may greatly reduce the contact area with the target metal layer. As stated in the background, a slight shrink phenomena may occur in the existing process for forming the via, especially for the via with a high depth-to-width ratio, and this phenomena results in that the size of the bottom of the via is smaller than that of the top of the via, and the contact resistance is increased.

Therefore, the embodiments of the disclosure provide a contact window structure, a metal plug and a forming method thereof, as well as a semiconductor structure. The method of forming the contact window structure includes the following steps. A target layer is provided. An annular pad is formed on a surface of the target layer, and a central via, from which partial surface of the target layer is exposed, in the middle part of the annular pad. A dielectric layer covering the target layer and the annular pad is formed. The dielectric layer is etched to form an etch hole connected to the central via in the dielectric layer. The annular pad is removed to form the contact window structure. Through forming the annular pad, in forming the contact window structure, after the annular pad is removed, a size of the central via may be enlarged, so that a size of a bottom of the contact window structure may be enlarged; and in forming the metal plug in the contact window structure, a contact area between a bottom of the metal plug and the target layer may be increased, and a contact resistance between the two is reduced. Furthermore, due to the existence of the annular pad, a depth or depth-to-width ratio of the etch hole formed in the dielectric layer may be reduced, so that the difficulty in forming hole etching is reduced, and therefore, in forming the etch hole, there is no need to increase the size of the etch hole or even may reduce the size of the etch hole to improve the integration, that is, a size of a top of the formed contact window structure may be the same as or smaller than a size of a top formed according to the related technology, while the size of the bottom of the formed contact window structure is increased.

In order to make the objectives, features and advantages of the embodiments of the disclosure more apparent and understandable, specific implementation of the disclosure will be described in detail below in combination with the drawings.

When describing the embodiments of the present disclosure in detail, for ease of description, the schematic diagrams will not be partially enlarged according to a general scale, and the schematic diagrams are only examples, which should not limit the protection scope of the embodiments of the present disclosure herein. Respective to describing the embodiments of the disclosure in detail, for ease of description, the schematic diagrams will be partially enlarged at a non-normal scale, and the schematic diagrams are only examples, which should not limit the protection scope of the embodiments of the disclosure herein. Furthermore, a three-dimensional space size of length, width and depth should be included in practical manufacturing.

Figure 2:
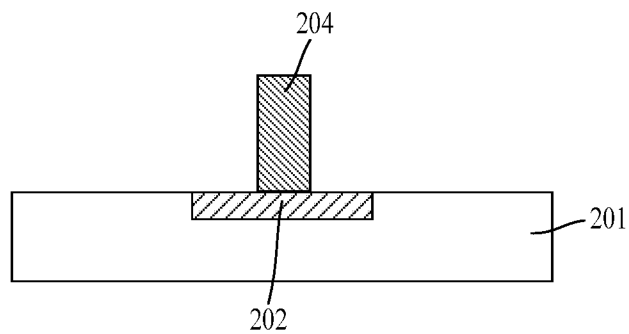
FIG. 2 to FIG. 14 illustrate schematic diagrams of cross-section structures in a process of forming a contact window structure according to embodiments of the disclosure.

Referring to FIG. 2, a substrate 201 is provided. A target layer 202 is formed in the substrate 201, and the substrate 201 exposes a surface of the target layer 202.

In some embodiments, the substrate 201 may be a semiconductor substrate. The target layer 202 may be a doped region (for example, a region doped with N-type impurity ions or doped with P-type impurity ions) located in the semiconductor substrate or a metal silicide region (for example, a nickel silicide region or a cobalt silicide region) located in the semiconductor substrate. The semiconductor substrate may be made of silicon (Si), germanium (Ge) or silicon-germanium (GeSi), silicon carbide (SiC); or may be Silicon-on-Insulator (SOI), Germanium-on-Insulator (GOI); or may be other materials, for example, group III-V compounds such as gallium arsenide.

In other embodiments, the substrate 201 may include the semiconductor substrate and an interlevel dielectric layer located on the semiconductor substrate, and the target layer 202 is located in the interlevel dielectric layer. The interlevel dielectric layer may has a monolayer or multilayer stack structure, the target layer 202 may be a metal layer, and the metal layer may be connected with a conductive structure (for example, a conductive plug) formed in the lower dielectric layer.

The surface of the target layer 202 may be flush with a surface of the substrate 201, or is slightly higher than the surface of the substrate 201.

There may be one or more (greater than or equal to 2) target layers 202 formed in the substrate 201. When there are multiple target layers 202, adjacent target layers are separated from each other. The substrate 201 with only one target layer 202 is illustrated as an example in this embodiment.

An annular pad is to be formed on the target layer 202 subsequently. For the subsequent forming of the annular pad, in one embodiment, a columnar structure 204 is formed on partial surface of the target layer 202.

The columnar structure 204 determines a position and a shape of the subsequently formed annular pad. The columnar structure may be of a cylindrical shape or an elliptic cylindrical shape, or other suitable shapes (a cube shape or an oblong shape). A bottom area of the columnar structure 204 is smaller than an area of the target layer 202.

A material of the columnar structure 204 may be different from materials of the target layer 202, the substrate 201 and the subsequently formed annular pad. In the subsequent process of removing the columnar structure 204, the columnar structure 204 has a higher etch selectivity ratio than that for the target layer 202, the substrate 201 and the annular pad, and etching damage to the target layer 202, the substrate 201 and the annular pad is reduced or prevented.

The columnar structure 204 may be made of a photoresist material or a mask material. The mask material may be one or more of silicon nitride, silicon oxide, silicon carbonitride, silicon oxynitride, polysilicon, amorphous silica, amorphous carbon and low-K dielectric material.

In one embodiment, the columnar structure 204 is made of the photoresist material, and the process of forming the columnar structure 204 includes the following steps. A photoresist layer is formed on the substrate 201 and the target layer 202. The photoresist layer is subjected to exposure and development to form the columnar structure on the target layer 202.

In another embodiment, the columnar structure 204 is made of the mask material, and the process of forming the columnar structure 204 includes the following steps. A mask material layer is formed on the substrate 201 and the target layer 202. The mask material layer is subjected to etching to form the columnar structure on the target layer 202.

Figure 3:
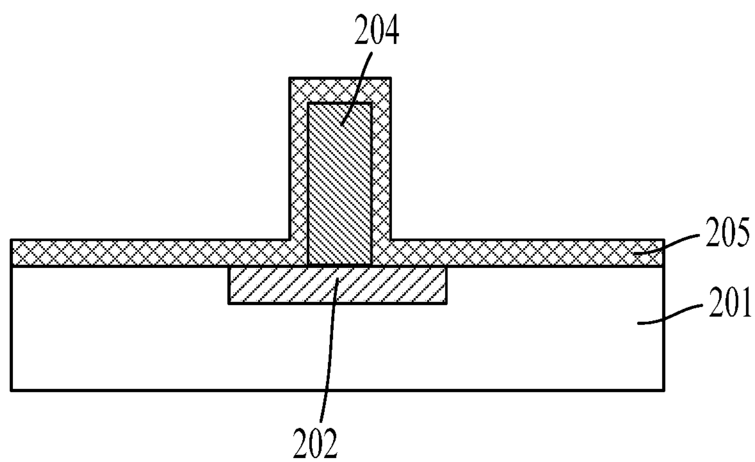

Referring to FIG. 3, a pad material layer 205 is formed on a side wall and a top surface of the columnar structure 204, the substrate 201 and partial surface of the target layer 202.

The pad material layer 205 is subsequently used for forming the annular pad. The pad material layer 205 is made of a material different from that of the subsequently formed dielectric layer. In forming an etching hole in the dielectric layer subsequently, the dielectric layer has a higher etch selectivity ratio relative to that of the annular pad.

The pad material layer 205 may be made of one or more of silicon nitride, silicon oxide, silicon carbonitride and silicon oxynitride. The pad material layer is formed by using a chemical vapor deposition process.

A thickness of the pad material layer 205 determines a width of the subsequently formed annular pad and an enlarged size of a central via. The thickness of the pad material layer is 3 times or more of the size of the columnar structure or the subsequently formed central via. At the forgoing specific proportion, a size of a bottom of the central via may be efficiently enlarged in the subsequent process, so as to enable the central via to meet practical requirements. The thicker the deposited pad material layer is, the larger the size and area of the window after the pad material is removed is.

Figure 4:
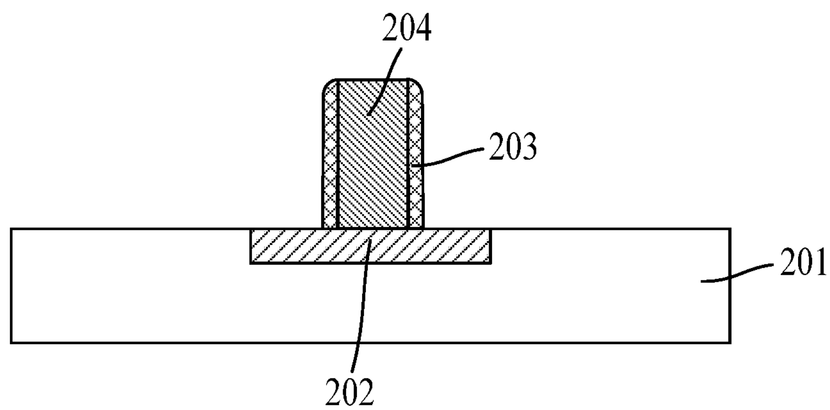

Referring to FIG. 4, the pad material layer on the top surface of the columnar structure 204 as well as the substrate 201 and the partial surface of the target layer 202 is removed by etching without a mask, to form an annular pad 203 on a surface of the side wall of the columnar structure 204.

The pad material layer is etched by an anisotropic dry etching process, which may be a plasma etching process.

Through the formed annular pad 203, in the subsequent process of forming a contact window structure, when the annular pad is removed, the size of the central via may be enlarged, so that the size of the bottom of the contact window structure may be enlarged; and in forming a metal plug in the contact window structure, a contact area between a bottom of the metal plug and the target layer may be increased, and a contact resistance between the bottom of the metal plug and the target layer is reduced. Furthermore, due to the existence of the annular pad, a depth or depth-to-width ratio of the etch hole formed in the dielectric layer may be reduced, so that the difficulty of forming hole etching is reduced. and therefore, there is no need to increase the size of the etch hole to form the etch hole, or the size of the etch hole may even be reduced to improve the integration. That is, a size of a top of the formed contact window structure may be the same as or smaller than a size of a top formed according to the related technology, while the size of the bottom of the formed contact window structure is increased.

Figure 5:
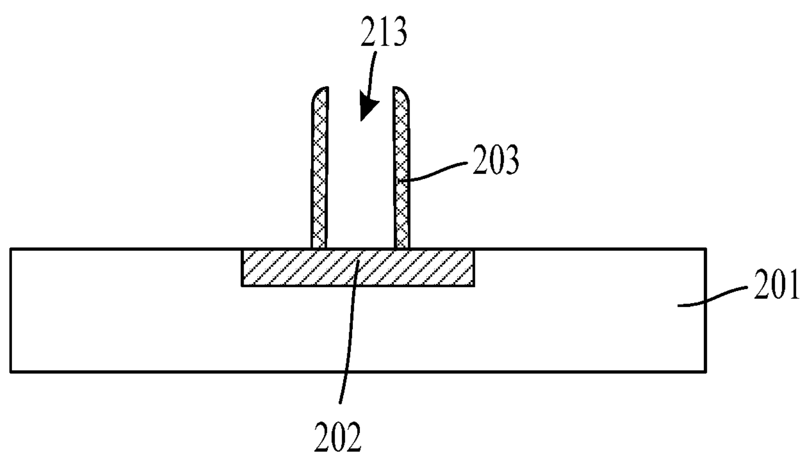

Referring to FIG. 5, the columnar structure is removed. A central via 213 is formed in the middle part of the annular pad 203, and partial surface of the target layer 202 is exposed from the central via 213.

The columnar structure may be removed by wet etching or dry etching. In removing the columnar structure, an etch solution or etch gas with a higher etch selectivity ratio is used for the columnar structure relative to that for the annular pad 203, the target layer 202 and the substrate 201.

Figure 6:
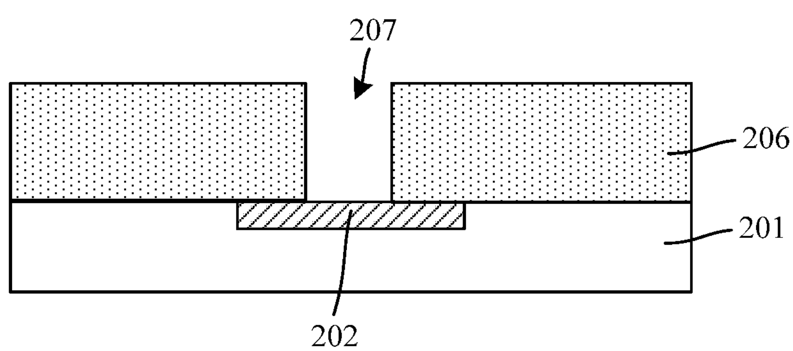
Figure 7:
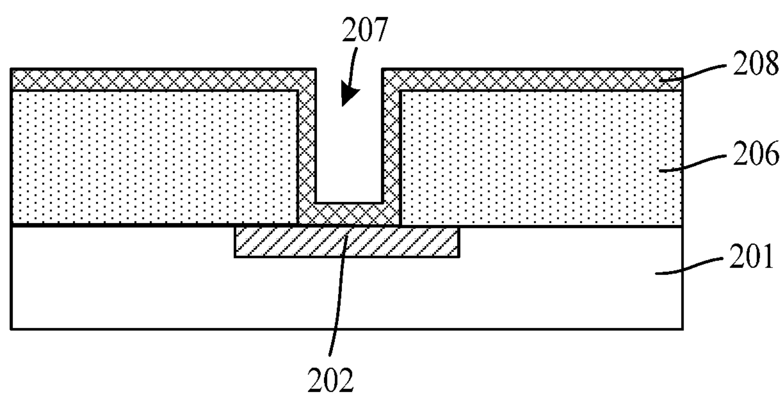
Figure 8:
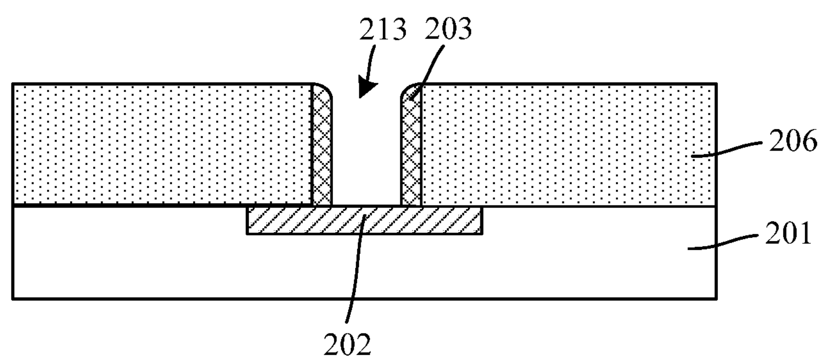

Another embodiment of the disclosure further provides a method of forming the annular pad 203. Referring to FIG. 6 to FIG. 8, first refer to FIG. 6, a mask material layer 206 is formed on the substrate 201 and partial surface of the target layer 202. A first via 207, from which the partial surface of the target layer is exposed, 202 is formed in the mask material layer 206.

The mask material layer 206 may be made of one or more of photoresist, silicon nitride, silicon oxide, silicon carbonitride, silicon oxynitride, polysilicon, amorphous silica, amorphous carbon and low-K dielectric material. The mask material layer 206 may be formed by using the chemical vapor deposition process.

In one embodiment, the mask material layer 206 is made of a photoresist material, and the first via 207 is formed in the mask material layer 206 by exposure and developing processes. When the mask material layer 206 is made of other materials, the first via 207 may be formed in the mask material layer 206 by an etching process.

A shape and a position of the first via 207 determines a shape and a position of the subsequently formed annular pad.

Referring to FIG. 7, a pad material layer 208 is formed on a side wall and a bottom surface of the first via 207 as well as a surface of the mask material layer 206.

The pad material layer 208 is subsequently used for forming the annular pad. The pad material layer 208 is made of a material different from that of a subsequently formed dielectric layer. In forming an etching hole in the dielectric layer subsequently, the dielectric layer has a higher etch selectivity ratio that that of the annular pad.

The pad material layer 208 may be made of one or more of silicon nitride, silicon oxide, silicon carbonitride and silicon oxynitride. The pad material layer is formed by using the chemical vapor deposition process.

A thickness of the pad material layer 208 determines a width of the subsequently formed annular pad and an enlarged size of a central through hole. In one embodiment, the thickness of the pad material layer 208 is 3 times or more of the size of the columnar structure or the subsequently formed central via.

Referring to FIG. 8, the pad material layer on the surface of the mask material layer 206 and the bottom surface of the first via is etched without a mask and removed to form the annular pad 203 on a surface of the side wall of the first via. The central via 213 is formed in the middle part of the annular pad 203.

The pad material layer is etched by an anisotropic dry etching process, which may be a plasma etching process.

In one embodiment, the mask material layer 206 is removed after forming the annular pad 203. The mask material layer 206 may be removed by a wet etching process or a dry etching process.

In another embodiment, if the mask material layer 206 is made of an isolation material and may be used for electrical isolation between devices, for example, when the mask material layer is made of a material the same as that of the subsequently formed dielectric layer, after the annular pad 203 is formed, the mask material layer 206 is retained, and the dielectric layer is directly formed on the mask material layer 206 subsequently, so that there is no need of an additional step to remove the mask material layer 206.

Figure 9:
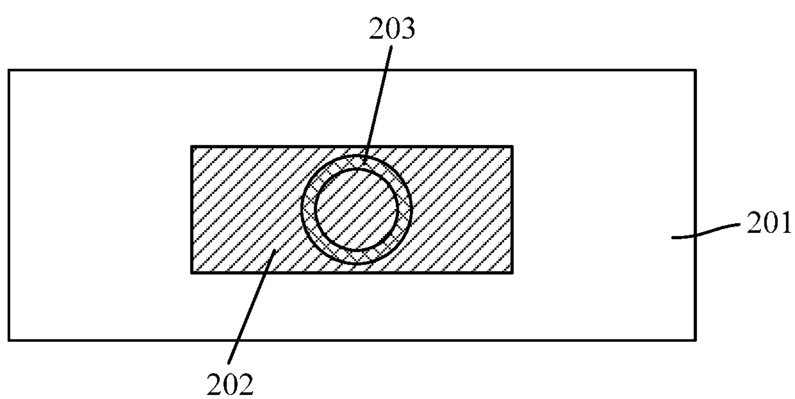
Figure 10:
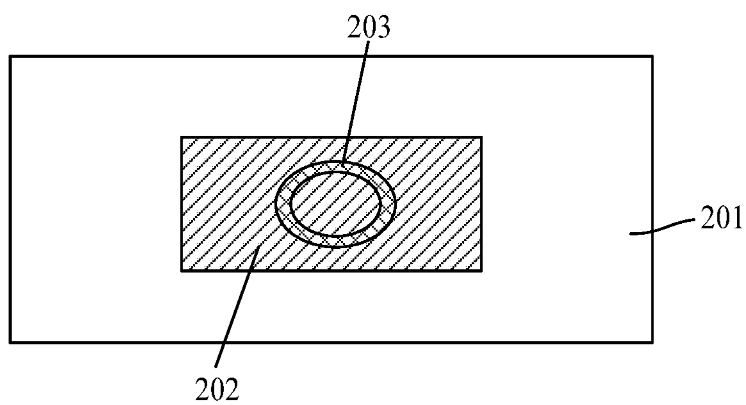

Referring to FIG. 9 and FIG. 10, FIG. 9 and FIG. 10 are top schematic diagrams of the structure of the foregoing formed annular pad 203. The annular pad 203 shown in FIG. 9 is of a circular ring shape, which facilitate the design of the contact window structure. The annular pad 203 shown in FIG. 10 is of an elliptic shape, which may reduce a resistance of a metal plug formed in the contact window structure subsequently. In other embodiments, the pad may of a strip shape, which may reduce the resistance of the metal plug formed in the contact window structure subsequently.

Figure 11:
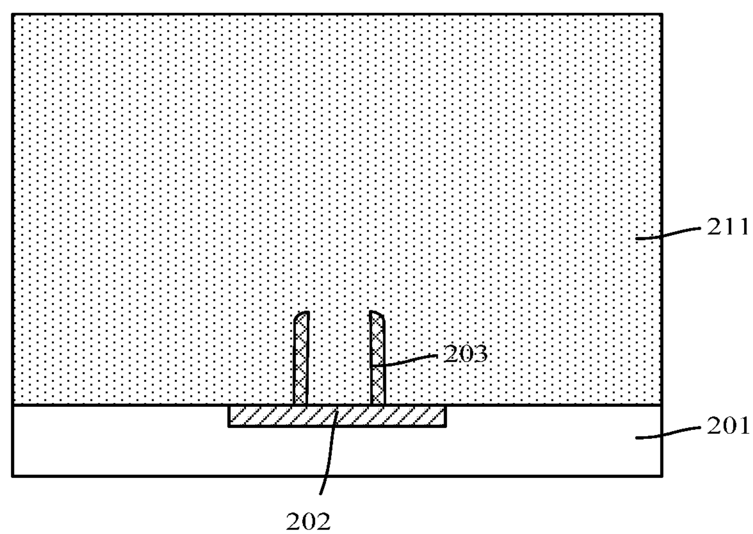

Referring to FIG. 11, FIG. 11 is carried out on the basis of FIG. 5. A dielectric layer 211 is formed covering the substrate 201, the target layer 202 and the annular pad 203.

The dielectric layer 211 is made of a material different from that of the annular pad 203. The dielectric layer 211 may be made of one of silicon nitride, silicon oxide, silicon carbonitride and silicon oxynitride.

The dielectric layer 211 is formed by chemical vapor deposition. In one embodiment, the dielectric layer 211 may be flatted by a flattening process, such that the dielectric layer 211 has a flat surface. The flattening process may be a chemical mechanical grinding process.

In one embodiment, the central via in the middle part of the annular pad 203 may be fully filled with the formed dielectric layer 211. In another embodiment, the central via may be partially filled or not filled with the dielectric layer 211. An air gap is formed in the annular pad. After the subsequent step of forming the etch hole in the dielectric layer, when continuing downward etching, it is very easy to expose the central via in the middle part of the annular pad 203 again, so as to prevent the influence on the size of the etch hole due to excessive long etching time. In one embodiment, the air gap is formed by adjusting a step coverage rate of a depositing process during forming of the dielectric layer 211.

Figure 12:
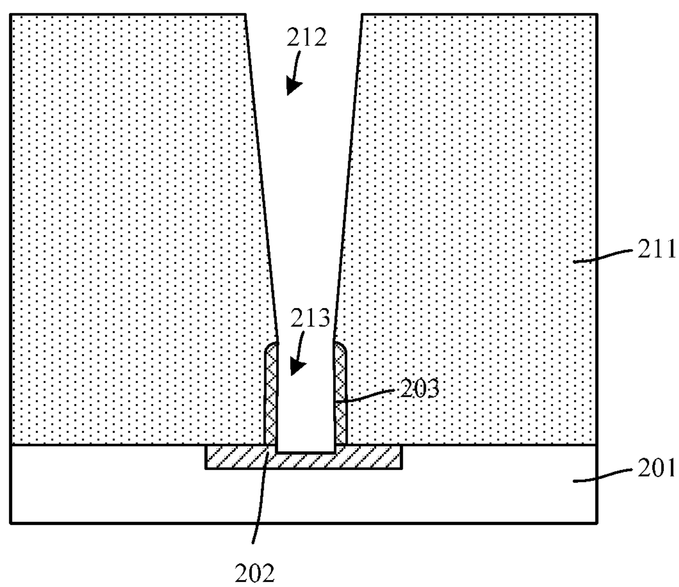

In another embodiment, before the dielectric layer is formed, the central via in the middle part of the annular pad 203 may be filled with a sacrificial layer. In a subsequent step of etching the dielectric layer to form the etch hole, an etching rate of the sacrificial layer is greater than an etching rate of the dielectric layer, so that it is also very easy to expose the central via in the annular pad 203 again, so as to prevent the influence on the size of the etch hole due to excessive long etching time. In one embodiment, when the dielectric layer material is silicon oxide, the sacrificial layer may be made of a semiconductor insulation material such as silicon nitride, silicon oxynitride, silicon carbonitride or silicon oxycarbide. Referring to FIG. 12, the dielectric layer 211 is etched, to form an etch hole 212 connected to the central via 213 in the dielectric layer 211.

In one embodiment, before the dielectric layer 211 is etched, a patterned mask layer (for example, a patterned photoresist layer or a stack structure of patterned hard mask layers and photoresist layers) is formed on the dielectric layer 211. The patterned mask layer is used as a mask to etch the dielectric layer 211.

After the etch hole 212 is formed, a material (for example, a dielectric layer material or a sacrificial layer material) filled in the central via 213 in the bottom of the etch hole 212 is continuously etched, so as to expose the central via 213 again and enable the etch hole 212 to be connected to the central via 213.

In one embodiment, the etch hole 212 formed in the dielectric layer 211 still has a high depth-to-width ratio, so that the size of the top of the formed etch hole 212 will be smaller than that of the bottom of the etch hole 212, that is, in a direction from an upper surface to a lower surface of the dielectric layer 211, the size of the etch hole 212 is gradually reduced. In other embodiments, the size of the top of the etch hole and the size of the bottom of the etch hole may be the same.

In one embodiment, the dielectric layer 211 may be etched by an anisotropic dry etching process, such as an anisotropic plasma etching process. For etching the dielectric layer 211 to form the etch hole 212, the dielectric layer 211 has a high etch selectivity ratio relative to the annular pad 203 (a specific etch selectivity ratio may be greater than or equal to 2:1). A bottom position of the etch hole 212 may be defined by the annular pad 203, and a diameter of the bottom of the etch hole 212 is smaller than an outer diameter of the annular pad 203.

Figure 13:
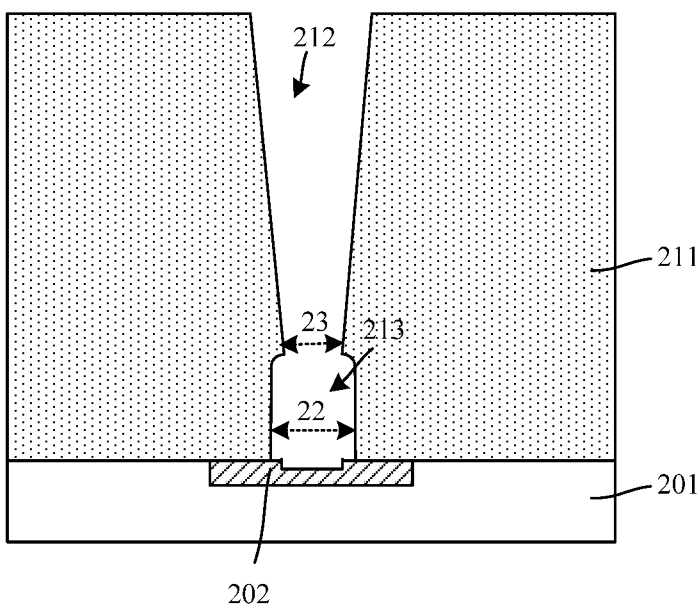

Referring to FIG. 13, the annular pad 203 is removed along the etch hole 212 and the central via 213 (referring to FIG. 12) to enlarge the size of the central via 213, and the contact window structure is formed by the etch hole 212 and the central via 213 with the enlarged size.

The annular pad may be removed by an isotropic wet or dry etching process. In one embodiment, when the material of the annular pad 203 is silicon nitride, the annular pad 203 is removed by wet etching. An etching solution used for the wet etching is hot phosphoric acid.

After the etched pad is removed, the size of the central via 213 is enlarged, such that a size 22 of the central via 213 will be greater than a size 23 of the bottom of the etch hole 212, that is, the size of the bottom of the formed contact window is increased relative to the size of the bottom of the contact window structure formed according to the related technology. In a subsequent process of forming a metal plug in the contact window structure, a contact area between a bottom of the metal plug and the target layer may be increased, and a contact resistance between the bottom of the metal plug and the target layer is reduced.

In one embodiment, in the process of forming the contact window, the target layer 202 is partially etched.

Figure 14:
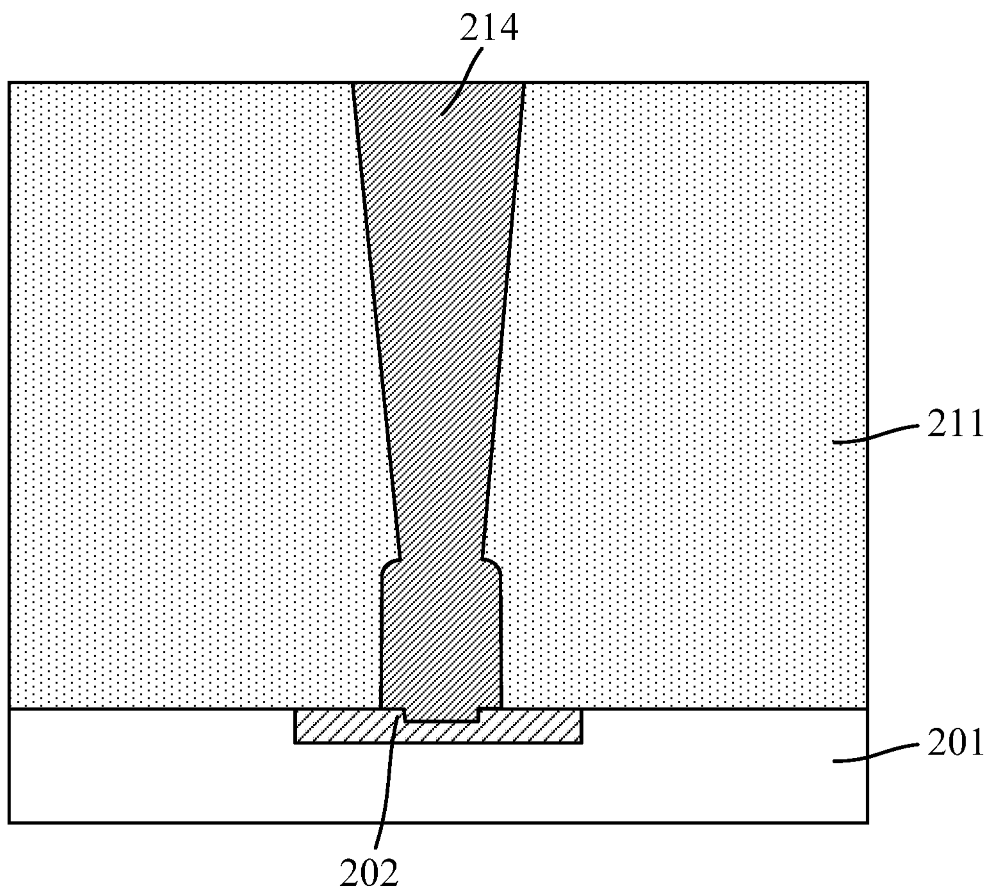

In one embodiment, referring to FIG. 14, after the contact window structure is formed, the contact window structure is filled with metal to form a metal plug 214.

The metal plug 214 is made of metal or other suitable conductive materials.

In one embodiment, a process of forming the metal plug 214 includes the following steps. A conductive material layer is formed on the contact window structure and a surface of the dielectric layer 211. The contact window structure is fully filled with the conductive material layer. The conductive material layer may be formed from metal (for example, tungsten) through a sputtering process. The conductive material layer higher than the surface of the dielectric layer 211 is removed by a chemical mechanical grinding process, and the metal plug 214 is formed in the contact window structure.

In another embodiment, after the contact window structure is formed, a capacitor structure is formed in the contact window structure.

The embodiments of the disclosure further provide a semiconductor structure. Referring to FIG. 12, the semiconductor structure includes a target layer 202, an annular pad 203, a dielectric layer 211 and an etch hole 212.

The annular pad 203 is located on a surface of the target layer 202, and a central via 213, from which partial surface of the target layer 202 is exposed, is formed in the middle part of the annular pad 203.

The dielectric layer 211 covers the target layer 202 and the annular pad 203.

The etch hole 212 is located in the dielectric layer 211 and is connected to the central via 213.

It should be noted that definition or description of similar or same structures in the present embodiment (the semiconductor structure) and the forgoing embodiments (the forming process of the contact window structure) will not be defined in the present embodiment. Referring to the definition or description in the corresponding sections of the foregoing embodiments for details.

Another embodiment of the disclosure further provides a contact window structure. Referring to FIG. 13, the contact window structure includes a target layer 202, a dielectric layer 211 and a contact window.

The dielectric layer 211 is located on the target layer 202.

The contact window is located in the dielectric layer 211. The contact window includes an etch hole 212 and a central via 213 connected to each other. The etch hole 212 is located above the central via 213. Partial surface of the target layer is exposed from the central via 213. A size of the central via 213 is greater than that of a bottom of the etch hole 212.

It should be noted that definition or description of similar or same structures in the present embodiment (the contact window structure) and the forgoing embodiments (the forming process of the contact window structure) will not be defined in the present embodiment. Referring to the definition or description in the corresponding sections of the foregoing embodiments for details.

Another embodiment of the disclosure further provides a metal plug. Referring to FIG. 14, the metal plug includes a target layer 202, a dielectric layer 211, a contact window and a metal plug 214.

The dielectric layer 211 is located on the target layer 202.

The contact window is located in the dielectric layer 211. The contact window includes an etch hole 212 (referring to FIG. 13) and a central via 213 (referring to FIG. 13) connected to each other. The etch hole 212 is located above the central via 213. Partial surface of the target layer is exposed from the central via 213. A size of the central via 213 is greater than that of a bottom of the etch hole 212.

The contact window is filled with the metal plug 214.

It should be noted that definition or description of similar or same structures in the present embodiment (the metal plug) and the forgoing embodiments (the process of forming the contact window structure) will not be defined in the present embodiment. Referring to the definition or description in the corresponding sections of the foregoing embodiments for details. Although the embodiments of the disclosure have been disclosed as above in preferred embodiments, they are not intended to limit the embodiments of the disclosure. Any person skilled in the art may use the above disclosed method and technical contents to make possible changes and variations to the technical solution of the embodiments of the disclosure without departing from the spirit and scope of the embodiments of the disclosure. Therefore, any content that does not depart from the technical solutions of the embodiments of the disclosure, any simple variations, equivalent changes and modification made to the above embodiments based on the technical essence of the embodiments of the disclosure all fall within the protection scope of the technical solutions of the embodiments of the disclosure.

The invention claimed is:

1. A method of forming a contact window structure, comprising:

providing a target layer;

forming an annular pad on a surface of the target layer, wherein a central via, from which partial surface of the target layer is exposed, is formed in a middle part of the annular pad;

forming a dielectric layer covering the target layer and the annular pad;

etching the dielectric layer to form an etch hole connected to the central via in the dielectric layer; and removing the annular pad to form the contact window structure.

2. The method of forming the contact window structure of claim 1, wherein forming the annular pad comprises:

forming a columnar structure on the partial surface of the target layer;

forming a pad material layer on a side wall and a top surface of the columnar structure as well as the partial surface of the target layer;

removing the pad material layer on the top surface of the columnar structure and the partial surface of the target layer by etching, to form the annular pad on a surface of the side wall of the columnar structure; and removing the columnar structure.

3. The method of forming the contact window structure of claim 1, wherein forming the annular pad comprises:

forming a mask material layer on the partial surface of the target layer, wherein a first via, from which the partial surface of the target layer is exposed, is formed in the mask material layer;

forming a pad material layer on a side wall and a bottom surface of the first via as well as a surface of the mask material layer; and removing the pad material layer on the surface of the mask material layer and the bottom surface of the first via by etching, to form the annular pad on a surface of the side wall of the first via.

4. The method of forming the contact window structure of claim 3, further comprising:

after forming the annular pad, removing the mask material layer to form the dielectric layer on the target layer and the annular pad, or after forming the annular pad, retaining the mask material layer and forming the dielectric layer on the mask material layer.

5. The method of forming the contact window structure of claim 1, wherein in forming the dielectric layer, the central via in the middle part of the annular pad is fully filled with the dielectric layer.

6. The method of forming the contact window structure of claim 1, wherein in forming the dielectric layer, the central via is partially filled or not filled with the dielectric layer, and an air gap is formed in the annular pad.

7. The method of forming the contact window structure of claim 1, further comprising:

before forming the dielectric layer, filling the central via in the middle part of the annular pad with a sacrificial layer, wherein in etching the dielectric layer to form the etch hole, an etching rate for the sacrificial layer is greater than an etching rate for the dielectric layer.

8. The method of forming the contact window structure of claim 1, wherein a thickness of the annular pad is 3 times or more of a size of the central via.

9. The method of forming the contact window structure of claim 1, wherein in a process of forming the contact window structure, the target layer is partially removed by etching.

10. The method of forming the contact window structure of claim 1, further comprising:

providing a substrate, wherein the target layer is formed in the substrate, and a surface of the target layer is exposed from the substrate.

11. A method of forming a metal plug, comprising:

forming the contact window structure using the method of claim 1; and filling the contact window structure with metal to form the metal plug.

* * * * *